United States Patent
Rajski et al.

(10) Patent No.: US 10,379,161 B2
(45) Date of Patent: Aug. 13, 2019

(54) SCAN CHAIN STITCHING FOR TEST-PER-CLOCK

(71) Applicant: Mentor Graphics Corporation, Wilsonville, OR (US)

(72) Inventors: Janusz Rajski, West Linn, OR (US); Jedrzej Solecki, Poznan (PL); Jerzy Tyszer, Poznan (PL); Grzegorz Mrugalski, Swardzez (PL)

(73) Assignee: Mentor Graphics Corporation, Wilsonville, OR (US)

( * ) Notice: Subject to any disclaimer, the term of this patent is extended or adjusted under 35 U.S.C. 154(b) by 1361 days.

(21) Appl. No.: 13/920,004

(22) Filed: Jun. 17, 2013

(65) Prior Publication Data

US 2014/0372821 A1    Dec. 18, 2014

(51) Int. Cl.
 *G01R 31/3185* (2006.01)
(52) U.S. Cl.
 CPC ........ *G01R 31/318575* (2013.01); *G01R 31/318547* (2013.01)
(58) Field of Classification Search
 CPC .... G01R 31/318555; G01R 31/318572; G01R 31/318541; G01R 31/318536; G01R 31/318575; G01R 31/318547; H05K 999/99
 USPC ........................................................ 714/727
 See application file for complete search history.

(56) References Cited

U.S. PATENT DOCUMENTS

| | | | | | |
|---|---|---|---|---|---|
| 4,602,210 A | * | 7/1986 | Fasang | ........... | G01R 31/318572 714/731 |
| 5,828,579 A | * | 10/1998 | Beausang | ........ | G01R 31/31704 716/102 |
| 5,896,330 A | * | 4/1999 | Gibson | .................... | G11C 8/16 365/201 |
| 5,963,455 A | * | 10/1999 | Scepanovic | ......... | G06F 17/5072 716/119 |
| 6,434,733 B1 | * | 8/2002 | Duggirala | ...... | G01R 31/318536 716/124 |

(Continued)

OTHER PUBLICATIONS

B. Konemarnn, J. Mucha and G. Zwiehoff, Institut : "Built-In Logic Block Observation Techniques" 1979 IEEE Test Conference, Cherry Hill, New Jersey (1979).

(Continued)

*Primary Examiner* — Samir W Rizk
*Assistant Examiner* — Enam Ahmed (57) ABSTRACT

Various aspects of the present invention relate to scan chain stitching techniques for test-per-clock. With various implementations of the invention, a plurality of scan cell partitions are generated based on combinational paths between scan cells. Scan cells may be assigned to one or more pairs of scan cell partitions based on combinational paths between the scan cells. Each pair of the scan cell partitions comprises one stimuli partition and one compacting partition. Using the plurality of scan cell partitions generated, scan chains are formed based on at least information of combinational paths between scan cell partitions in the plurality of scan cell partitions. The formed scan chains are to be dynamically divided into three groups during a test, which are configured to operate in a shifting-launching mode, a capturing-compacting-shifting mode and a mission mode, respectively.

20 Claims, 10 Drawing Sheets

(56) References Cited

U.S. PATENT DOCUMENTS

| | | | |
|---|---|---|---|
| 7,249,298 B2* | 7/2007 | Sim | G01R 31/2891 714/726 |
| 7,509,551 B2* | 3/2009 | Koenemann | G01R 31/31703 714/732 |
| 7,657,807 B1* | 2/2010 | Watkins | G01R 31/318594 714/718 |
| 8,161,447 B2* | 4/2012 | Dirks | G06F 17/5072 714/727 |
| 8,356,222 B2* | 1/2013 | Mukherjee | G11C 29/20 714/718 |
| 9,335,377 B2 | 5/2016 | Rajski et al. | |
| 9,347,993 B2 | 5/2016 | Rajski et al. | |
| 2002/0120896 A1 | 8/2002 | Wang et al. | |
| 2003/0097614 A1 | 5/2003 | Rajski et al. | |
| 2007/0113129 A1 | 5/2007 | Balakrishnan et al. | |
| 2008/0148203 A1* | 6/2008 | Alpert | G06F 17/5072 716/114 |
| 2008/0235544 A1 | 9/2008 | Lai et al. | |
| 2009/0049418 A1* | 2/2009 | KleinOsowski | G06F 17/5072 716/119 |
| 2009/0070646 A1 | 3/2009 | Wang et al. | |
| 2009/0187799 A1* | 7/2009 | Jaber | G01R 31/318547 714/727 |
| 2009/0259900 A1 | 10/2009 | Rajski et al. | |
| 2010/0031101 A1* | 2/2010 | Kapur | G01R 31/318536 714/726 |
| 2010/0275077 A1 | 10/2010 | Rajski et al. | |
| 2010/0287430 A1 | 11/2010 | Wang et al. | |
| 2011/0231721 A1 | 9/2011 | Czysz et al. | |
| 2012/0217989 A1 | 8/2012 | Sinanoglu | |
| 2013/0185607 A1* | 7/2013 | Tekumalla | G01R 31/318536 714/726 |
| 2014/0095101 A1* | 4/2014 | Gizdarski | G01R 31/318335 702/120 |
| 2014/0208175 A1* | 7/2014 | Kumar | G01R 31/318536 714/727 |
| 2015/0100841 A1* | 4/2015 | Gizdarski | G01R 31/318537 714/727 |
| 2015/0106672 A1* | 4/2015 | Kulkarni | G01R 31/318558 714/727 |
| 2016/0252573 A1 | 9/2016 | Rajski et al. | |

OTHER PUBLICATIONS

L. H. Goldstein, "Controllability/observability analysis of digital circuits," IEEE Trans. Circuits Syst., vol. 26, pp. 685-693, 1979.

S. T. Chakradhar, A. Balakrishnan, and V. D. Agrawal, "An exact algorithm for selecting partial scan flip-flops," Proc. DAC, pp. 81-86, 1994.

T. F. Coleman and J. J. More, "Estimation of sparse Jacobian matrices and graph coloring problems", SIAM Journal of Numerical Analysis, vol. 20, pp. 187-209, 1983.

B. Konemann, J. Mucha and G. Zwiehoff: "Built-In Logic Block Observation Techniques" 1979 IEEE Test Conference, Cherry Hill, New Jersey (1979).

A. Krasniewski and S. Pilarski: "Circular Self-Test Path: A Low-Cost BIST Technique for VLSI Circuits", IEEE Transactions on Computer Aided Design, vol. 8, No. 1 (Jan. 1989).

\* cited by examiner

Flow chart 500

SCAN CHAIN STITCHING FOR TEST-PER-CLOCK

FIELD OF THE INVENTION

The present invention relates to the field of circuit testing technology. Various implementations of the invention may be particularly useful for scan-based testing.

BACKGROUND OF THE INVENTION

Since its introduction in the late 1960's, scan-based testing has gained a wide acceptance as a structured design-for-test (DFT) methodology. This methodology connects memory elements such as flip-flops and latches in a circuit to form scan chains and uses them to make internal nodes of the circuit highly controllable and observable. The controllability and observability enables high-quality automated test generation for large industrial circuit designs.

A commonly used scheme of the scan-based testing is test-per-scan. In a test-per-scan system, a test pattern is first shifted into scan chains and subsequently applied to the circuit-under-test. The test responses generated by the circuit-under-test are then captured by and shifted out of the scan chains for analysis. In this testing scheme, the shifting in and out operations require much more clock cycles to perform than the actual testing (i.e. launching and capturing) operation does. Moreover, in part due to power concerns, the shifting clock is usually kept slower than the clock for the circuit's normal operation. This further increases time for the data loading and unloading operations.

Consider, for example, a circuit design with 100,000 scan cells. These scan cells are divided into 500 scan chains, each 200 scan cells long. Assume the shifting and the normal operating clock frequencies of 50 MHz and 500 MHz, respectively. Applying 20,000 double-capture test patterns requires 4,000,000 shift cycles at 50 MHz and 40,000 capture cycles at 500 MHz. As a result, as low as 1% of cycles, or just 0.1% of time, is spent on the actual testing operation—applying test data and capturing test response data. If a BIST (built-in self-test) method is used for the same circuit design, the test time efficiency could be even lower. With 100K single-capture test patterns, 20,000,000 cycles are needed for scan shifting while only 100,000 cycles are needed for launching and capturing. Using the same clock frequencies as the above example, 99.95% of test time is spent on scan shifting. The above two examples demonstrate that the test-per-scan scheme, though well developed and widely adopted, is not very efficient with respect to testing time.

An alternative scheme, test-per-clock, has been developed mainly for BIST. In a conventional test-per-clock BIST system, the outputs of a test pattern generator are directly coupled to the inputs of the circuit-under-test. Accordingly, a new test pattern is applied to the circuit-under-test at every test clock cycle.

A 1979 paper by Konemann et al., "Built-in logic block observation techniques," 1979 IEEE Test Conference, which is incorporated herein by reference, describes such a system referred to as BILBO (built-in logic block observer). A BILBO is composed of a flipflop register with additional gates for shift and feedback operations. Four different operational modes can be performed by the BILBO: a mission mode (normal circuit functional mode with scan cells working as latches), a linear shift register mode, a feedback mode, and a reset mode for register resetting. In the feedback mode, the BILBO can work either as a multiple-input signature register (MISR) for compacting test responses or as a linear feedback shift register (LFSR) for generating pseudorandom test patterns. The latter is accomplished by keeping constant values at the parallel inputs of the scan chain.

The 1979 paper describes an example of a test-per-clock architecture with BILBOs working in pairs. One BILBO in a BILBO pair is configured to operate in the feedback mode functioning as a linear feedback shift register. This LFSR BILBO generates and launches a test pattern every test clock cycle. In the meantime, the other BILBO in the pair is configured to operate also in the feedback mode but functioning as a multiple-input signature generator. This MISR BILBO captures a test response every test clock cycle and compacts it with its previously compacted test response to form a new compacted test response. After a number of test clock cycles, a test response signature is eventually shifted out of the MISR BILBO by switching its operational mode from the feedback mode to the linear shift register mode. The unloaded test response signature can then be analyzed.

Another test-per-clock BIST system is described in a 1989 paper by Krasniewski et al., "Circular self-test path: a low cost BIST technique for VLSI circuits," IEEE Trans. CAD, vol. 8, pp. 46-55, 1989, which is incorporated herein by reference. This system uses a feedback shift register with the last flipflop being supplied to the first flipflop. This shift register serves simultaneously for test pattern generation and test response compaction.

Compared to the test-per-scan scheme, the test-per-clock scheme is more time-efficient because no slow shifting operation is needed for every test pattern. However, the conventional test-per-clock BIST scheme may have a problem on power consumption. In the traditional test-per-clock BIST scheme, all scan chains change their contents every clock cycle no matter whether they are used for pattern generation or for test response compaction. This can lead to excessive circuit toggling and thus power dissipation. Moreover, the traditional test-per-clock scheme has been developed mainly for BIST. It is thus desirable to develop a new test-per-clock scheme that not only is more time-efficient than the test-per-scan scheme but also addresses the limitations of the existing test-per-clock scheme. Disclosed below are techniques related to a test-per-clock scheme based on dynamically-partitioned reconfigurable scan chains. More specifically for this disclosure, scan chain stitching techniques for test-per-clock are discussed.

BRIEF SUMMARY OF THE INVENTION

Various aspects of the present invention relate to scan chain stitching techniques for test-per-clock. With various implementations of the invention, a plurality of scan cell partitions are generated based on combinational paths between scan cells.

In some embodiments of the invention, scan cells may be assigned to one or more pairs of scan cell partitions based on combinational paths between the scan cells. Each pair of the scan cell partitions comprises one stimuli partition and one compacting partition.

To generate a pair of scan cell partitions, a scan cell having a highest number of combinational paths directed to from other scan cells may be first assigned to the compacting partition. Scan cells having combinational paths to the scan cell may then be assigned to the stimuli partition. Next, scan cells having combinational paths directed to from scan cells in the stimuli partition may be assigned to the compacting partition. Next, scan cells having combinational paths to scan cells in the compacting partition may be assigned to the stimuli partition. During these operations, a predetermined condition on the number of non-mission scan cells may be monitored.

In some other embodiments of the invention, scan cells may be assigned to a plurality of scan cell partitions through a graph coloring approach.

Using the plurality of scan cell partitions generated, scan chains are formed based on at least information of combinational paths between scan cell partitions in the plurality of scan cell partitions. A cost function may be used to represent the information of combinational paths between scan cell partitions. The formed scan chains are to be dynamically divided into three groups during a test, which are configured to operate in a shifting-launching mode, a capturing-compacting-shifting mode and a mission mode, respectively.

DETAILED DESCRIPTION OF THE INVENTION

Various aspects of the present invention relate to scan chain stitching techniques for test-per-clock. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "generate," "form" and "assign" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1:
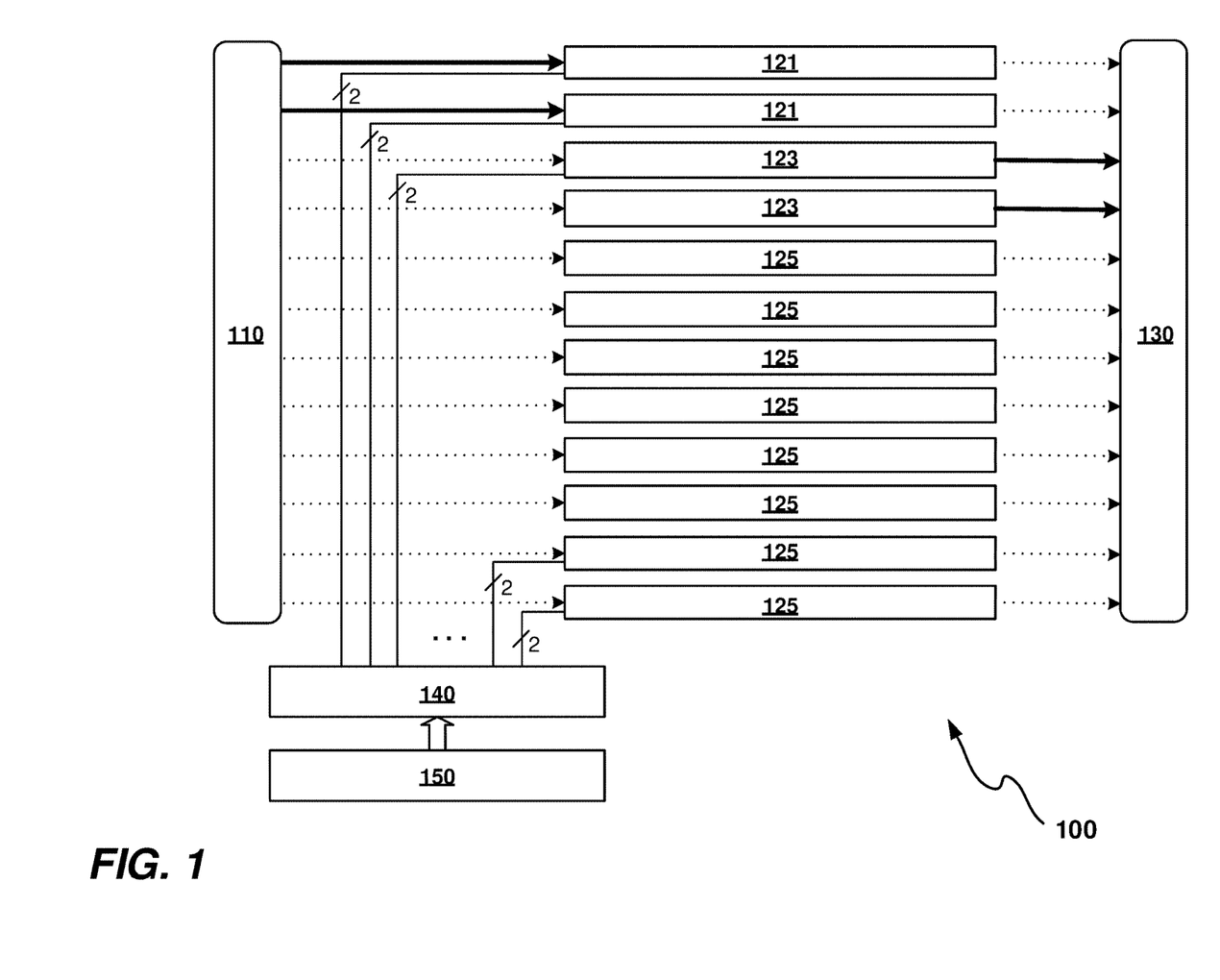
FIG. 1 illustrates an example of a test architecture for test-per-clock based on dynamically partitioned and reconfigurable scan chains that may be employed by various embodiments of the invention.

FIG. 1 illustrates an example of a test architecture for test-per-clock that may be employed by various embodiments of the invention. The test architecture 100 comprises a test stimuli source 110, scan chains 121-125, a test response collector 130, a configuration register 140 and a configuration source 150. The test stimuli source 110 may be an ATE (automated test equipment), a test data decompressor driven by an ATE, a PRPG (pseudorandom pattern generator), or any device that can supply test patterns in some form. The ATE is commonly used for deterministic testing. The deterministic testing usually employs test patterns generated by ATPG (automatic test pattern generation). To test a large circuit, compressed test patterns are often used. Before being shifted into scan chains, the compressed test patterns are decompressed by the test data decompressor. For non-deterministic testing such as BIST, the PRPG can serve as the test stimuli source.

The test response collector 130 in the test architecture 100 may be the same ATE used as the test stimuli source 110, a test response compactor, or any device that can collect and perhaps analyze test responses shifted out of the scan chains. The test response compactor may compact test responses spatially, temporally, or both. The spatial compaction may be achieved by using a spatial compactor constructed with elementary gates such as AND, OR, NAND and NOR gates. The temporal compaction may be accomplished by using, for example, a multiple-input signature register (MISR).

The test stimuli source 110 and the test response collector 130 described above are similar to those used in a conventional test architecture. The scan chains 121-125 in the test architecture 100, however, are configured differently from conventional scan chains. Unlike conventional scan chains, scan chains used in various embodiments of the invention can operate, depending on a control signal, in one of at least three modes: a shifting-launching mode, a capturing-compacting-shifting mode and a mission mode. In the mission mode, scan chains perform regular circuit functions; in the shifting-launching and capturing-compacting-shifting modes, scan chains are used for testing the circuit. Specifically, scan chains in the shifting-launching mode are responsible for controlling the internal states of the circuit-under-test. They shift test data in and applying them to the circuit-under-test every clock cycle. Moreover, they do not capture any test responses. Scan chains in the capturing-compacting-shifting mode, on the other hand, are responsible for collecting test response data generated by the circuit-under-test. They shift out one bit of a previously compacted test response signal while compacting remaining bits of the previously compacted test response signal with a currently-captured test response signal to form a currently compacted test response signal.

In FIG. 1, the scan chains 121, 123 and 125 are shown to work in the shifting-launching mode, the capturing-compacting-shifting mode and the mission mode, respectively. The control signal for mode switching is generated by the configuration source 150 and applied to the scan chains 121, 123 and 125 by the configuration register 140. FIG. 1 only illustrates one configuration (partition) of the scan chains. Different partitions of the scan chains can be obtained by varying the control signal. The content of the configuration register 140 can be reloaded during a test session, depending on various requirements. In particular, the control signal may be varied with test patterns applied. The configuration source 150 may be an on-chip device or an external device.

As seen in the figure, a majority of the scan chains operate in the mission mode. This arrangement can alleviate power issues because logic states associated with these scan chains closely resemble those when the circuit works in its designed functional mode. Only a small portion of the scan chains may cause extrinsic circuit toggling. In a conventional at-speed scan test, by contrast, a capture clock burst is applied to all scan chains which can result in a sudden current change within a few nanoseconds and thereby circuit failures.

Figure 2:
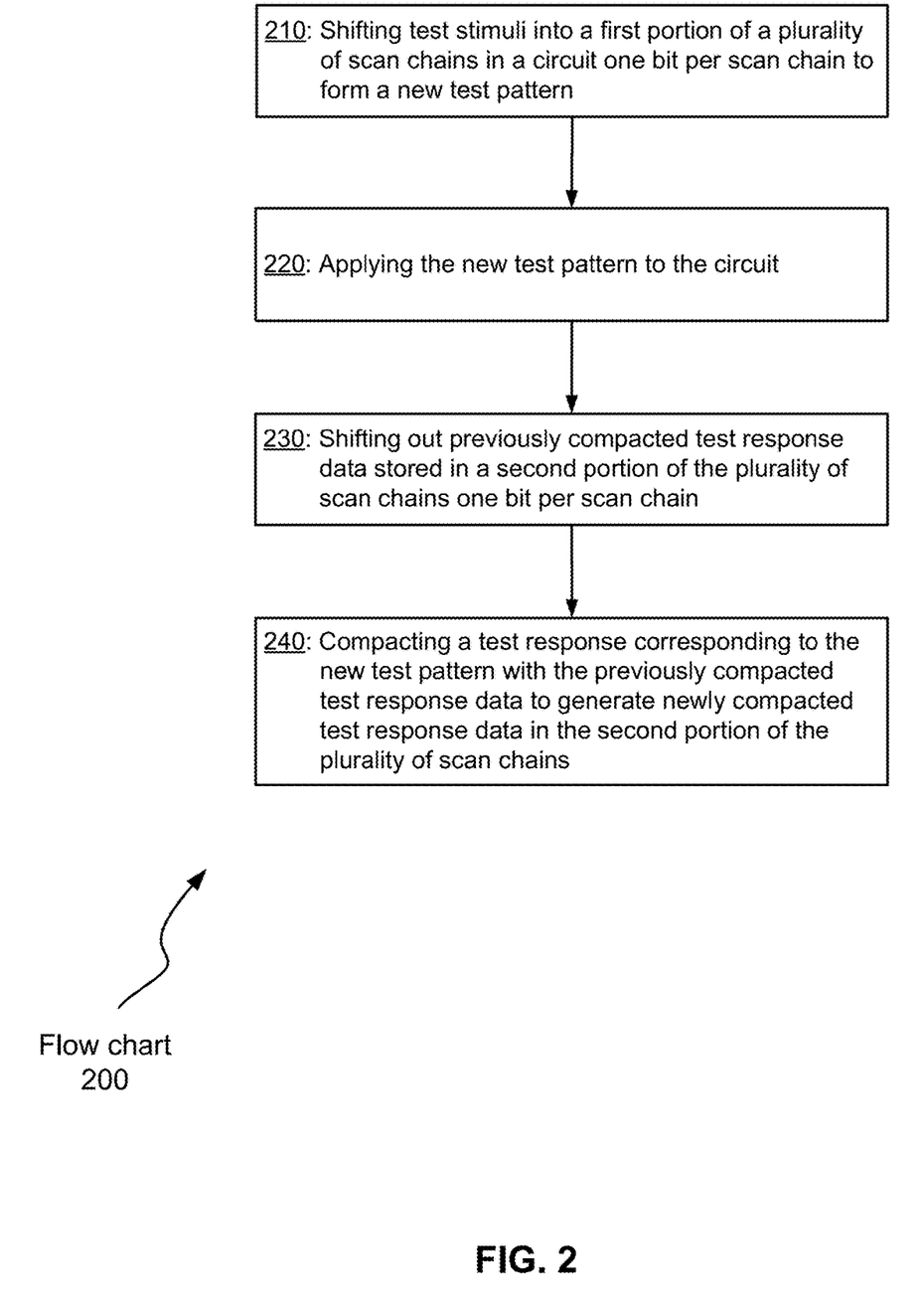
FIG. 2 illustrates a flow chart describing methods of test-per-clock based on dynamically-partitioned configurable scan chains that may be employed by various embodiments of the invention.
Figure 3:
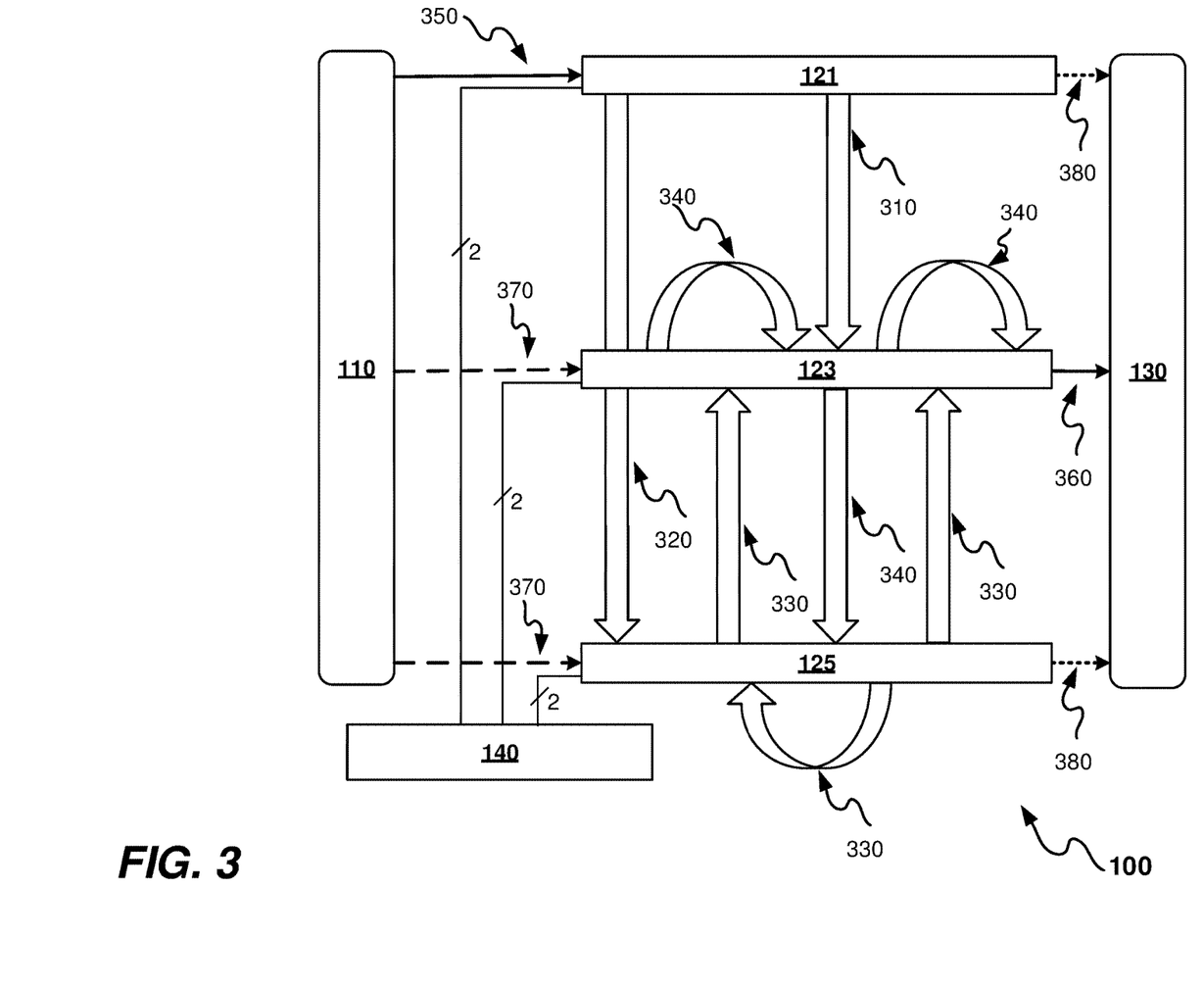
FIG. 3 illustrates an example of how the scan chains 121-125 in FIG. 1 interact with each other during testing.

FIG. 2 illustrates a flow chart 200 describing methods of test-per-clock based on dynamically-partitioned configurable scan chains that may be employed by various embodiments of the invention. FIG. 3 illustrates an example of how the scan chains 121-125 in FIG. 1 interact with each other during testing. To simplify the figure, only one scan chain is used to represent scan chains in each operation mode. For ease of understanding, methods of test-per-clock based on dynamically partitioned and reconfigurable scan chains that may be employed according to various embodiments of the invention will be described with reference to the flow chart 200 in FIG. 2 and the test architecture 100 illustrated in FIG. 3. It should be appreciated, however, that alternate implementations of a test architecture may be used to perform the methods of test-per-clock based on dynamically-partitioned configurable scan chains illustrated by the flow chart 200 according to various embodiments of the invention. Likewise, the test architecture 100 may be employed to perform other methods of test-per-clock based dynamically-partitioned configurable scan chains according to various embodiments of the invention.

In operation 210, test stimuli are shifted from a stimuli source (test stimuli source 110) into a first portion of a plurality of scan chains in a circuit (scan chains 121) one bit per scan chain to form a new test pattern as illustrated by an arrow 350. The connections between the test stimuli source 110 and the scan chains 123 and 125 are blocked as illustrated by arrows 370 with broken lines.

Immediately after being formed, in operation 220, the new test pattern is applied to the circuit. The new test pattern propagates through the combinational part of the circuit until a test response reaches a second portion of the plurality of scan chains (scan chains 123) as illustrated by an arrow 310. A circuit response caused by the new test pattern also reaches a third portion of the plurality of scan chains (scan chains 125) as illustrated by an arrow 320. This circuit response will circulate within the circuit and eventually reach the scan chains 123 as illustrated by arrows 330.

In operation 230, the scan chains 123 shift out previously compacted test response data one bit per scan chain to the test response collector 130 as illustrated by an arrow 360. The connections between the test response collector 130 and the scan chains 121 and 125 are blocked as illustrated by arrows 380 with broken lines.

At about the same time as the operation 230, in operation 240, the test response corresponding to the new test pattern is compacted with the previously compacted test response data to generate newly compacted test response data in the scan chains 123. As shown in FIG. 3, the scan chains 123 are also employed to drive the circuit as illustrated by arrows 340, which is referred to as a mode of capturing-compacting-shifting without blocking. This functionality can be disabled if needed and the scan chains operate in a mode referred to as a mode of capturing-compacting-shifting with blocking.

As noted previously, the scan chains 121, 123 and 125 are configured to operate in the shifting-launching mode, the capturing-compacting-shifting mode and the mission mode, respectively, based on the control signal stored in the configuration register 140. The above four operations may be performed once for every clock cycle for a predetermined number of times. At the end, a different control signal may be loaded into the configuration register 140 to reconfigure the scan chains. The reconfigured scan chains are then employed for the next test pattern(s). This dynamic partitioning and reconfiguring approach contrasts not only the conventional scan method but also the BILBO approach discussed in the background section.

Another difference between various embodiments of the present invention and the BILBO-based techniques may lie in the operation of test response compaction. As previously noted, a BILBO scan chain in the feedback mode works as a multiple-input signature generator for compacting test responses: Test responses are captured and compacted for a number of clock cycles (corresponding to the same number of test patterns) to generate a signature. No bit of the compacted test response signal is shifted out during that time period. Instead, the signature is shifted out after a number of test patterns are applied. By contrast, a scan chain in the capturing-compacting-shifting mode according to various embodiments of the invention does not have a feedback loop. Moreover, one bit of previously compacted test response data is shifted out every clock cycle.

By adopting the test-per-clock scheme, various embodiments of the invention remove the lengthy scan shift-in phase used in the test-per-scan scheme and perform launch-capture testing every clock cycle. This allows more test patterns to be applied within a certain period of time and may improve the fault coverage. Alternatively, one can choose to apply the same number of test patterns as that of a conventional scan test, yet in a much shorter period of time, thereby reducing the test cost.

By dynamically partitioning and reconfiguring the scan chains, the disclosed test-per-clock scheme can allow the majority of scan chains to operate in the mission mode to alleviate power issues without significant impact on test generation and fault coverage. The control signal remains static after a given configuration is established. It can, therefore, be placed and routed with no rigid timing constrains similar to those of scan enable signals whose distribution and delivery, especially for the at-speed test purpose, must meet non-flexible timing closure conditions. The low-power capabilities may enable applying test patterns at higher, close to the functional, frequency, which can further increase fault coverage metrics.

As the above disclosure indicates, scan chains in the shifting-launching mode do not capture test responses and scan chains in the capturing-compacting-shifting mode do not launch test stimuli. By contrast, scan chains for test-per-scan usually perform both. Therefore, conventional scan chain stitching techniques, typically attempting to minimize interconnection complexity, may not suffice to meet the requirements of the disclosed scan-per-clock scheme. This can be explained by an example illustrated in FIG. 4.

Figure 4:
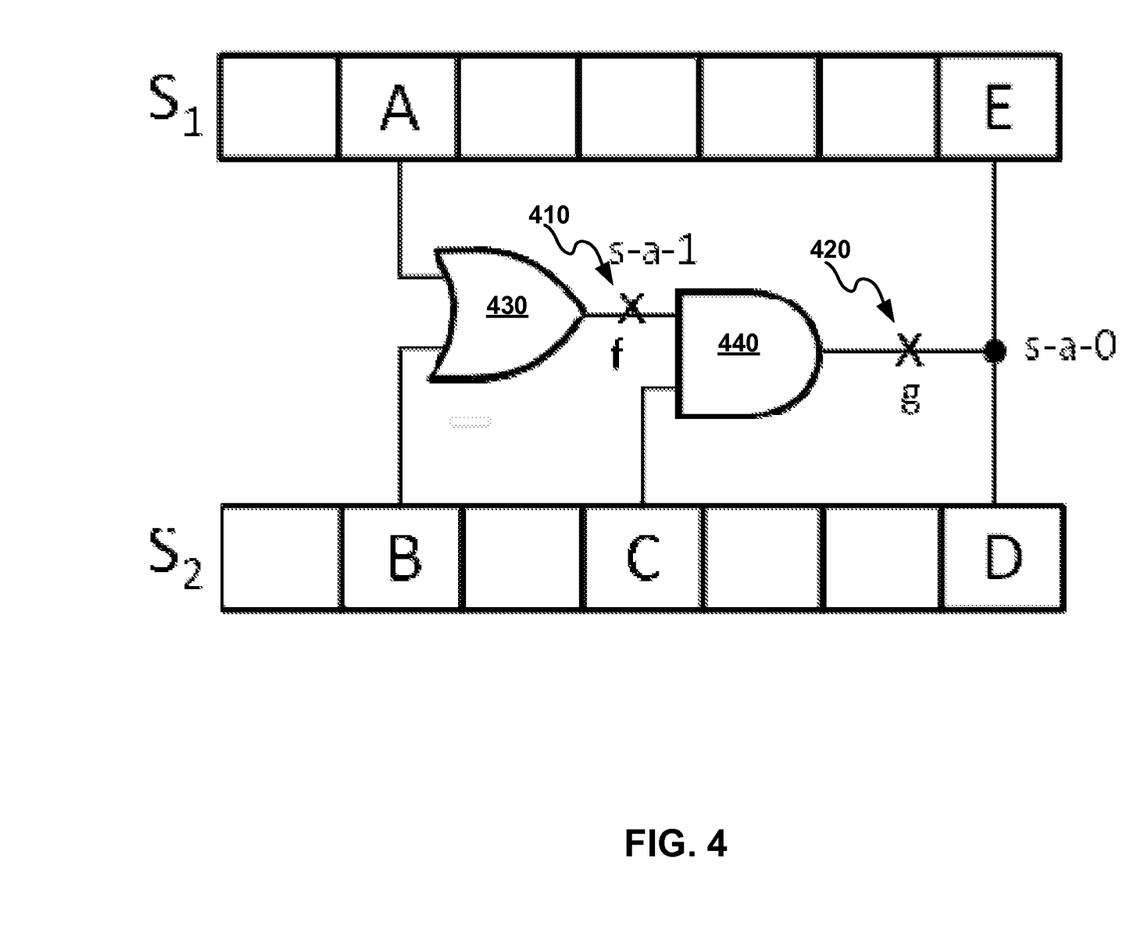
FIG. 4 illustrates an example of using two scan chains in a circuit to detect two stuck-at faults.

The circuit shown in FIG. 4 comprises two scan chains ($S_1$ and $S_2$), an OR gate 430 and an AND gate 440. The OR gate 430 is driven by scan cell A in the scan chain $S_1$ and scan cell B in the scan chain $S_2$ while the AND gate 440 is driven by the output of the OR gate 430 and scan cell C in the scan chain $S_2$. The output of the AND gate 440 can be observed at scan cells E and D in the scan chains $S_1$ and $S_2$, respectively.

Suppose a stuck-at-zero fault 420 is present as shown in FIG. 4. A test pattern that assigns the scan cells A and C to "1" detects the fault 420 when a "0" is captured and observed by D, E, or both. Here, one of the two scan chains must be loaded with a specified bit and capture the test responses. Consequently, this test pattern cannot be used for the disclosed test-per-clock scheme.

Another test pattern that assigns the scan cells B and C to "1" detects the fault 420 when a "0" is captured and observed by D, E, or both. Similar to the above example, using D for observation is not feasible under the disclosed test-per-clock scheme. Using E for observation, however, is a viable solution because $S_1$ and $S_2$ can be configured to operate in the capturing-compacting-shifting mode and the shifting-launching mode, respectively.

Consider a stuck-at-1 fault 410 shown in FIG. 4. To detect the fault, C must be set to "1" while A and B must be set to "0". Accordingly, one of the two scan chains must be used for both launching test stimuli and capturing test responses. Unless the scan chains are adjusted, the stuck-at-1 fault 410 cannot be detected under the disclosed test-per-clock scheme. This demonstrates that the test quality of the disclosed test-per-clock scheme can be significantly affected by how scan cells are stitched to form scan chains.

Figure 5:
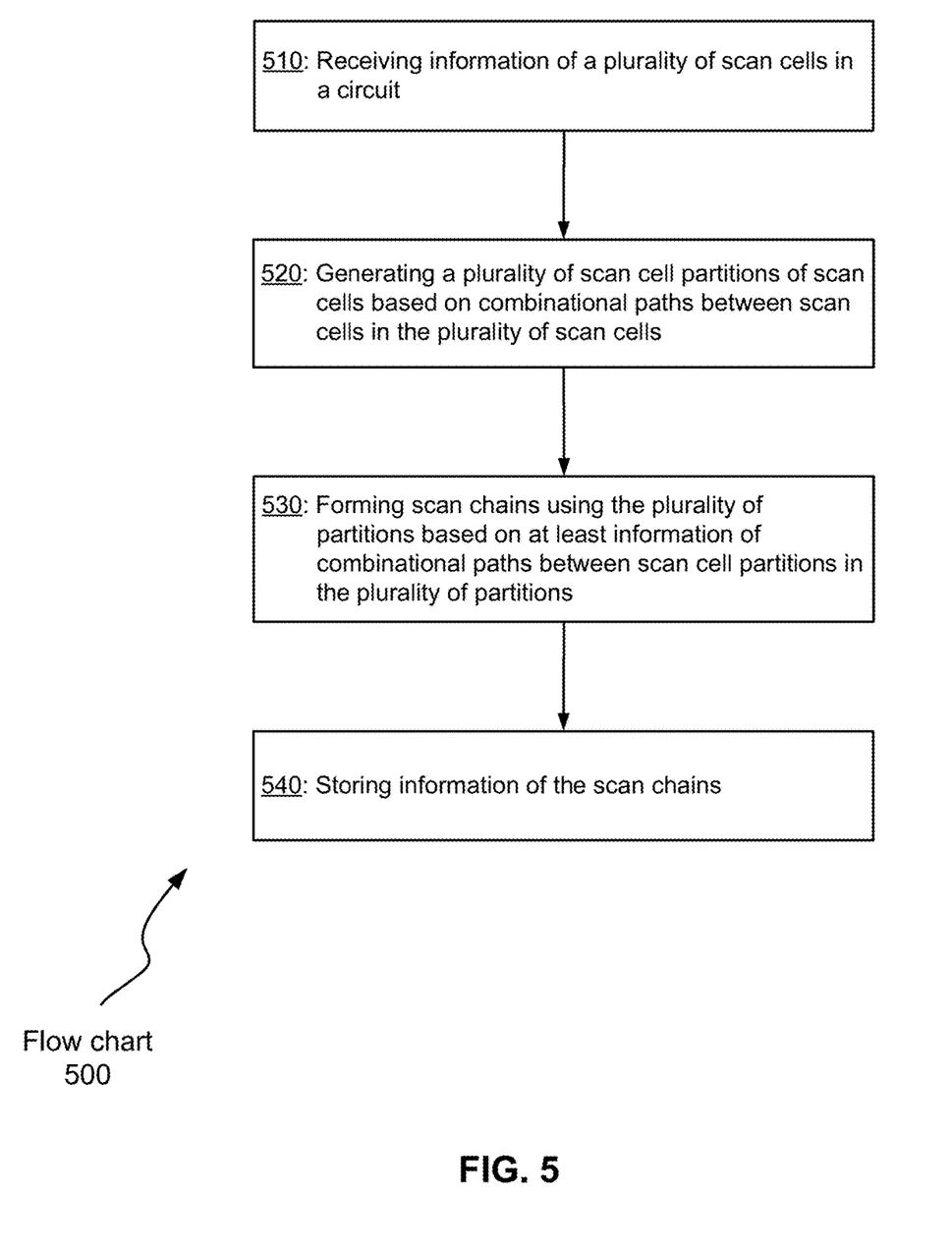
FIG. 5 illustrates a flow chart describing methods of scan chain stitching that may be employed by various embodiments of the invention.

FIG. 5 illustrates a flow chart 500 describing methods of scan chain stitching that may be employed by various embodiments of the invention. The flowchart starts with operation 510, in which information of a plurality of scan cells in circuit is received.

Next, in operation 520, a plurality of scan cell partitions are generated based on combinational paths between scan cells in the plurality of scan cells. With various implementations of the invention, scan cells may be assigned to one or more pairs of scan cell partitions based on combinational paths between scan cells in the plurality of scan cells. Each pair of the scan cell partitions comprises one stimuli partition and one compacting partition.

Figure 6:
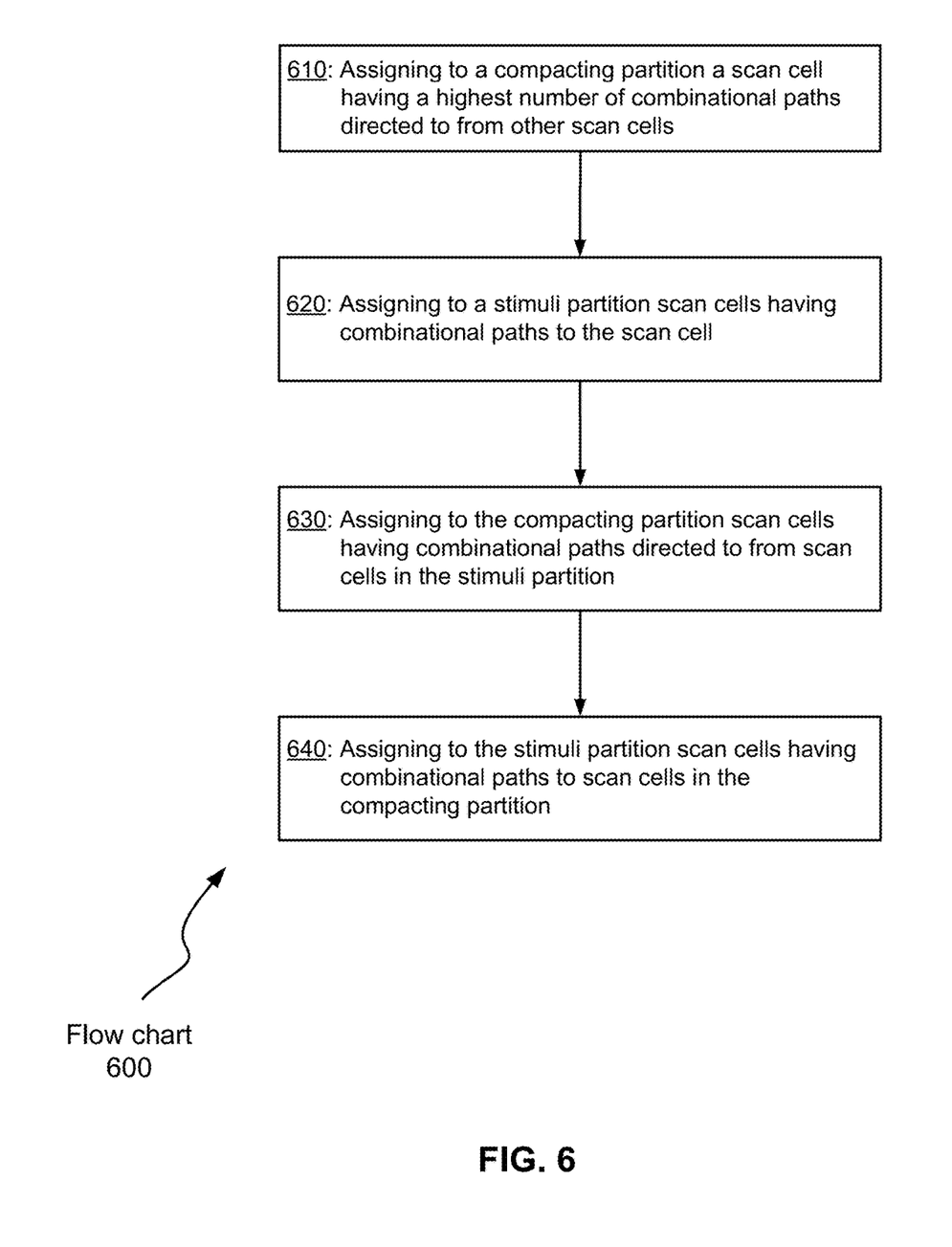
FIG. 6 illustrates a flow chart describing methods of scan cell partition generation according to some embodiments of the invention.
Figure 7:
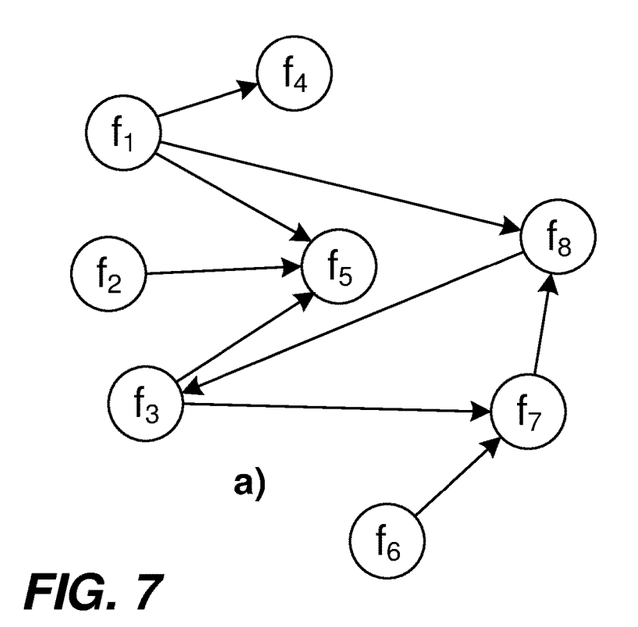
FIG. 7 illustrates an example of applying the flow chart 600 in FIG. 6 based on a structure graph of scan cells.

FIG. 6 illustrates a flow chart 600 describing methods of scan cell partition generation according to some embodiments of the invention, and FIG. 7 illustrates an example of applying the flow chart 600 based on a structure graph of scan cells. In the structure graph of scan cells, vertices $f_1$-$f_8$ represents scan cells and a directed edge from one vertex $f_i$ to another vertex $f_j$ represents a combinational path directed from $f_i$ to $f_j$ ($f_i$ is said to control $f_j$). The length of the shortest path between two vertices determines a sequential depth between the two vertices.

In operation 610 of the flow chart 600, a scan cell having a highest number of combinational paths directed to from other scan cells is assigned to a compacting partition. Such a scan cell may be a good candidate for an observation point within a certain region of the circuit-under-test. In the example of FIG. 7, $f_5$ has the largest fan-in cone (three combinational paths directed to from scan cells $f_1$, $f_2$ and $f_3$) and is thus assigned to a compacting partition.

In operation 620, scan cells having combinational paths to the scan cell is assigned to a stimuli partition. These scan cells may be good candidates for loading test stimuli. In the example of FIG. 7, $f_1$, $f_2$ and $f_3$ are connected to $f_5$ by directed edges (combinational paths) and are thus assigned to a stimuli partition.

In operation 630, scan cells having combinational paths directed to from scan cells in the stimuli partition are assigned to the compacting partition. These scan cells are controlled by the scan cells in the stimuli partition. In the example of FIG. 7, $f_4$, $f_7$ and $f_8$ are assigned to a compacting partition.

Figure 8:
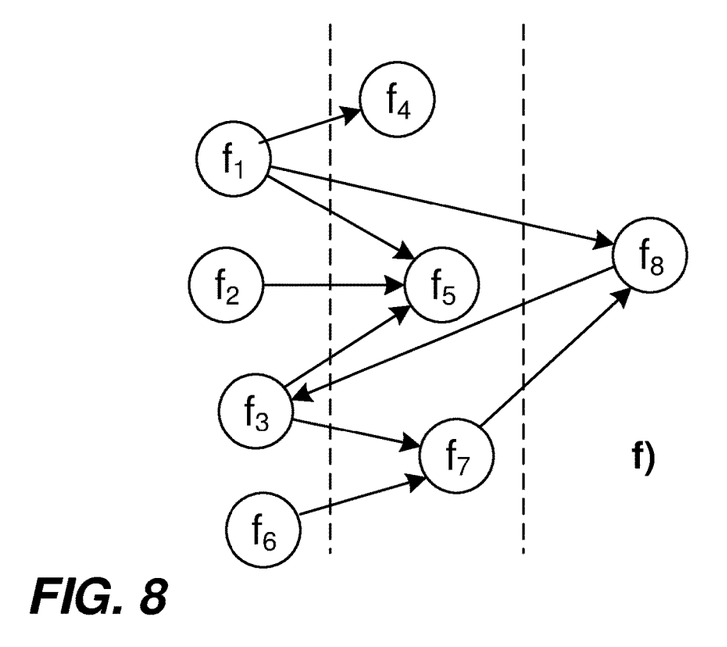
FIG. 8 illustrates a partitioning result of the scan cells shown in FIG. 7.

In operation 640, scan cells having combinational paths to scan cells in the compacting partition are assigned to the stimuli partition. In the example of FIG. 7, $f_6$ is assigned to the stimuli partition because it has a combinational path to $f_7$. This does not apply to $f_7$ despite the existence of a combinational path to $f_8$ because $f_7$ has already been assigned to the compacting partition previously. The partitioning result is shown in FIG. 8.

During the above operations, a predetermined condition on the number of non-mission scan cells (scan cells operated in the modes of shifting-launching and capturing-compacting-shifting) may be monitored. If the predetermined condition is satisfied while performing one of the operations, the operation is terminated. Information of the pair of stimuli and compacting partitions forms is stored as an assignment. The constraint on the number of non-mission scan cells limits potential circuit toggling caused by scan cells during a test and thus helps realize low-power testing.

If the predetermined condition is still unsatisfied after the operation 640, scan cells having combinational paths directed to from scan cells in the compacting group may be assigned to the compacting partition. These scan cells have a sequential depth of 2 with respect to corresponding scan cells in the stimuli partition. In FIG. 7, if the directed edge between $f_1$ and $f_8$ does not exist, $f_8$ will have a sequential depth of 2 with respect to $f_6$. Again, any scan cells having combinational paths to scan cells in the compacting partition and not in the compacting partition themselves may be assigned to the stimuli partition if the predetermined condition remains unsatisfied. This process may continue with deeper sequential depth until the predetermined condition or another condition such as a limit on the sequential depth is satisfied.

After an assignment is generated, more assignments (stimuli and compacting partition pairs) may be generated by following the flow chart 600 if there are more scan cells are available.

Another approach to generate a plurality of scan cell partitions in operation 520 of the flow chart 500 is graph coloring. This approach may apply sequential coloring heuristic to a circuit graph similar to the one illustrated in FIG. 7, so that no two adjacent vertices share the same color. The sequential coloring heuristic has been described in "Estimation of sparse Jacobian matrices and graph coloring problems," by T. F. Coleman and J. J. More, in SIAM Journal of Numerical Analysis, vol. 20, pp. 187-209, 1983, which is incorporated herein by reference. After the coloring, scan cells having the same color are not directly connected through combinational logic and forms a partition. In some embodiments of the invention that employ the graph coloring approach, the partitions are not separated into two types (stimuli and compacting) as the approach shown illustrated by the flow chart 600.

After the plurality of scan cell partitions have been generated, in operation 530 of the flow chart 500, scan chains are formed using the plurality of scan cell partitions based on at least information of combinational paths between scan cell partitions in the plurality of scan cell partitions. With various implementations of the invention, scan cell partitions in the plurality of scan cell partitions are combined to form scan chains based on a cost function for the plurality of scan chains. The cost function may be derived based on combination paths between scan cell partitions. Some embodiments of the invention adopt a matrix form for the cost function. Each element of the matrix (i, j) is assigned the number of combinational paths between scan cells in partitions i and j. The matrix element for a stimuli partition and a compacting partition in the same assignment may be set to be infinity so that the pair cannot be placed in the same scan chain.

Figure 12:
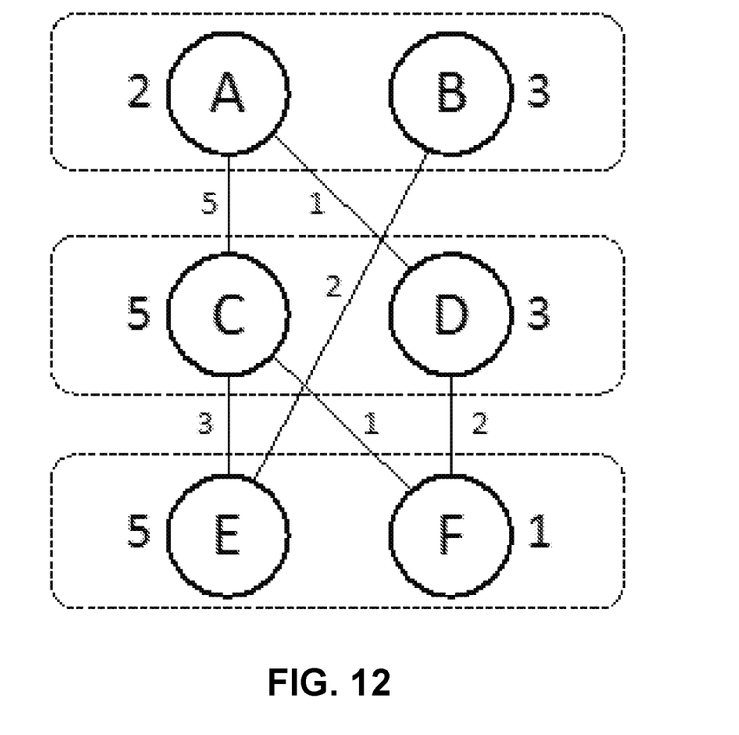
FIG. 12 illustrates an example of three pairs of scan cell partitions.

FIG. 12 illustrates an example of three pairs of scan cell partitions. Each node in the figure represents a partition. The size of each partition (the number of scan cells) is indicated with a number next to the node. The dotted lines group partitions belonging to the same assignment. A line connecting two nodes in different assignments indicates there are combination paths between scan cells in the two partitions. The number next to the line shows the number of the combinational paths the matrix element of the cost matrix. Table 1 shows the cost matrix.

TABLE 1

|   | A | B | C | D | E | F |
|---|---|---|---|---|---|---|
| A | — |   |   |   |   |   |
| B | ∞ | — |   |   |   |   |
| C | 5 | 0 | — |   |   |   |
| D | 1 | 0 | ∞ | — |   |   |
| E | 0 | 2 | 3 | 0 | — |   |
| F | 0 | 0 | 1 | 2 | ∞ | — |

Figure 9:
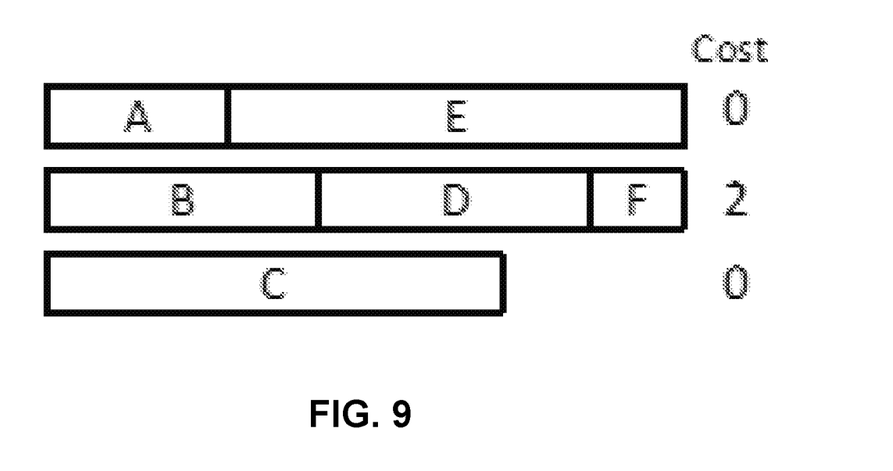
FIG. 9 illustrates an example of forming scan chains using the scan cell partitions shown in FIG. 8.

FIG. 9 illustrates an example of forming scan chains using the scan cell partitions shown in FIG. 12 based on the cost function in Table 1. The goal is to minimize the sum of costs for partitions in each scan chain. Suppose the preferable scan chain length is 7. The scan cell partition A is first selected to setup the first scan chain. Next, partition E is selected because of its lowest (0) connection cost with A. The first scan chain is completed because the total size of both partitions is 7. The unassigned partition B is now selected as a part of the second scan chain. Although its connection cost with C is 0, combining these two partitions into a single scan chain would exceed the scan size limit. Thus, partition D is selected. The total size of B and D is 6. This allows combining partition F at the cost of 2 resulting from the connection with D. The only partition left is C, which is used to create the third scan chain.

As will be appreciated by person of ordinary skill in the art, other factors may also be considered for the scan chain stitching such as circuit structure, layout constraints, and/or functional specification.

The formed scan chains may be adjusted by using testability measures. Assuming that every fault needs a single propagation site to be detected, the following approach can be applied:

1) Given n scan chains, generate n mode configurations, such that scan chain $s_i$, i=1, ..., n, is in the compaction mode, while other chains are put into the stimuli mode. For example, for three scan chains the assignments are <c, s, s>, <s, c, s>, <s, s, c>, where s and c denote stimuli and compaction modes, respectively.

2) For each configuration run sequential SCOAP analysis, record all detectable faults, and drop them from the fault list.

3) Perform ATPG for the remaining faults, and for each fault record all observation sites.

Figure 11:
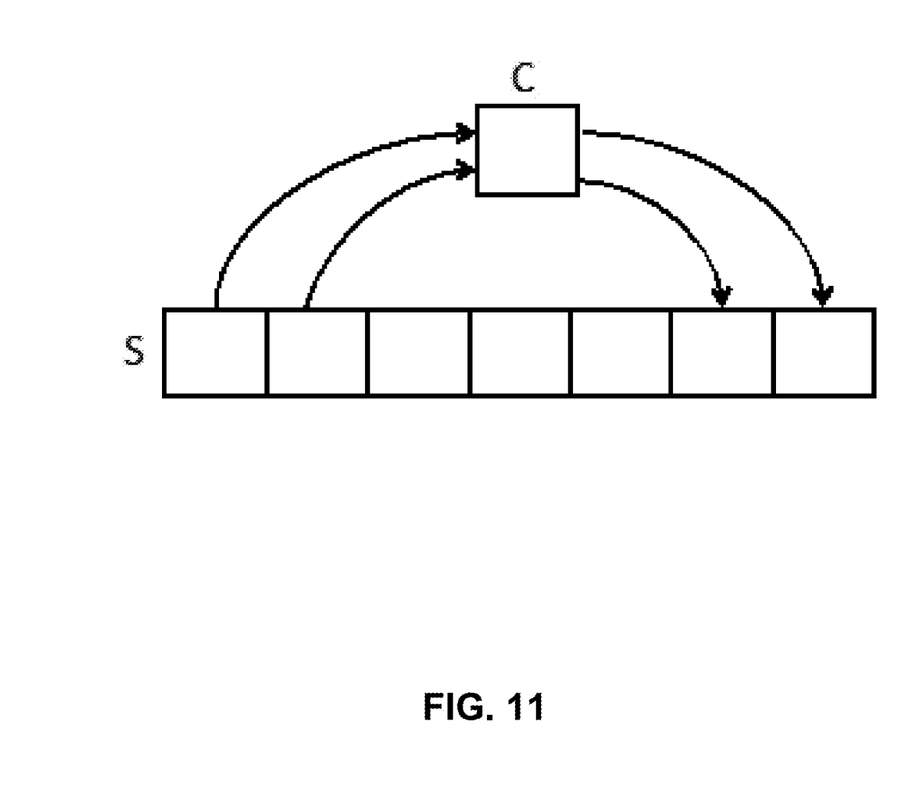
FIG. 11 illustrates an example of the connectivity measure for a scan chain.

4) Find the observation site p that captures the largest number of faults. For each scan chain, find the connectivity measure—the total number of directed connections from or to p. For example (see FIG. 11), the connectivity of scan chain s with chain c is equal to 4.

5) Move scan cell p to the scan chain with the lowest connectivity. If there are more scan chains with the lowest connectivity, then choose the shortest scan chains in order to keep the scan chains balanced.

The algorithm can be repeated until satisfactory fault coverage estimate is achieved. Also, steps 5 and 6 can be repeated multiple times for more than one observation site. It reduces the CPU time as steps 2 and 3 are the most time consuming.

Figure 10:
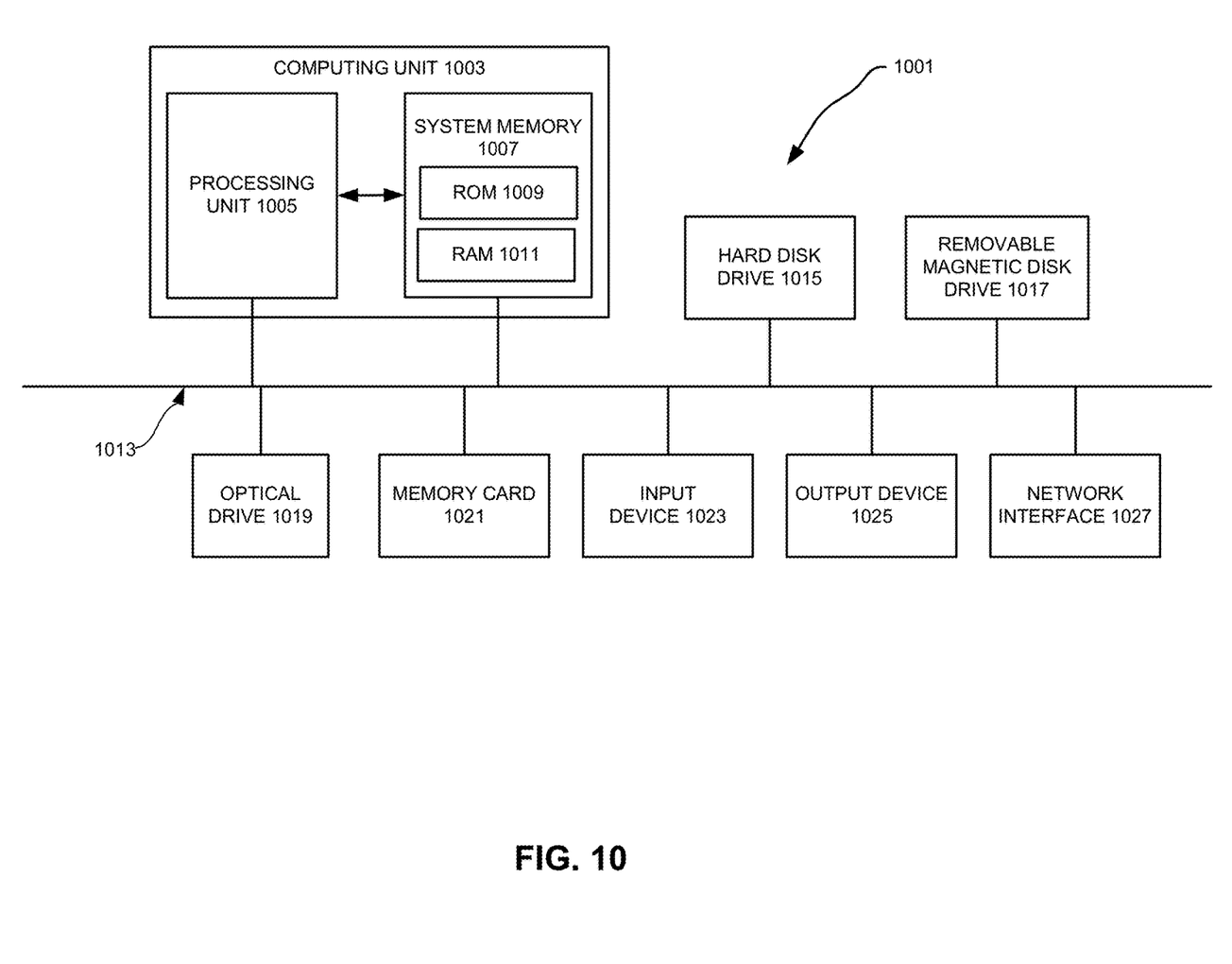
FIG. 10 illustrates a programmable computer system with which various embodiments of the invention may be employed.

Various embodiments of the invention may be implemented through the execution of software instructions by a computing device, such as a programmable computer. FIG. 10 shows an illustrative example of such a programmable computer (a computing device 1001). As seen in this figure, the computing device 1001 includes a computing unit 1003 with a processing unit 1005 and a system memory 1007. The processing unit 1005 may be any type of programmable electronic device for executing software instructions, but will conventionally be a microprocessor. The system memory 1007 may include both a read-only memory (ROM) 1009 and a random access memory (RAM) 1011. As will be appreciated by those of ordinary skill in the art, both the read-only memory (ROM) 1009 and the random access memory (RAM) 1011 may store software instructions for execution by the processing unit 1005.

The processing unit 1005 and the system memory 1007 are connected, either directly or indirectly, through a bus 1013 or alternate communication structure, to one or more peripheral devices. For example, the processing unit 1005 or the system memory 1007 may be directly or indirectly connected to one or more additional memory storage devices, such as a "hard" magnetic disk drive 1015, a removable magnetic disk drive 1017, an optical disk drive 1019, or a flash memory card 1021. The processing unit 1005 and the system memory 1007 also may be directly or indirectly connected to one or more input devices 1023 and one or more output devices 1025. The input devices 1023 may include, for example, a keyboard, a pointing device (such as a mouse, touchpad, stylus, trackball, or joystick), a scanner, a camera, and a microphone. The output devices 1025 may include, for example, a monitor display, a printer and speakers. With various examples of the computer 1001, one or more of the peripheral devices 1015-1025 may be internally housed with the computing unit 1003. Alternately, one or more of the peripheral devices 1015-1025 may be external to the housing for the computing unit 1003 and connected to the bus 1013 through, for example, a Universal Serial Bus (USB) connection.

With some implementations, the computing unit 1003 may be directly or indirectly connected to one or more network interfaces 1027 for communicating with other devices making up a network. The network interface 1027 translates data and control signals from the computing unit 1003 into network messages according to one or more communication protocols, such as the transmission control protocol (TCP) and the Internet protocol (IP). Also, the interface 1027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1001 is illustrated as an example only, and it not intended to be limiting. Various embodiments of the invention may be implemented using one or more computing devices that include the components of the computer 1001 illustrated in FIG. 10, which include only a subset of the components illustrated in FIG. 10, or which include an alternate combination of components, including components that are not shown in FIG. 10. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow chart 400 in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method for improved test-per-clock scan testing, executed by at least one processor of an electronic design automation (EDA) computer, comprising:
receiving, by the EDA computer, information of a plurality of scan cells in a design of a circuit;
generating, by the EDA computer, a plurality of scan cell partitions based on combinational paths between scan cells in the plurality of scan cells;
forming scan chains, by the EDA computer, using the plurality of scan cell partitions based on at least information of combinational paths between scan cell partitions in the plurality of scan cell partitions;
for each formed scan chain, stitching together, by the EDA computer, the respective scan cells in the circuit design;
coupling, by the EDA computer, the formed scan chains to a mode configuration register;
wherein the scan chains are configured to be dynamically divided into three groups during testing the circuit based on control signals stored in the mode configuration register, the groups configured to operate in a shifting-launching mode, a capturing-compacting-shifting mode, and a mission mode, respectively; and
storing, by the EDA computer, information of the scan chains.

2. The method recited in claim 1, wherein a scan chain in the capturing-compacting-shifting mode shifts out one bit of previously compacted test response data while compacting remaining bits of the previously compacted test response data with a currently-captured test response to form currently compacted test response data.

3. The method recited in claim 1, wherein the generating comprises:
assigning scan cells to one or more pairs of the scan cell partitions based on combinational paths between scan cells in the plurality of scan cells, each of the one or more pairs of the scan cell partitions comprising one stimuli partition and one compacting partition.

4. The method recited in claim 3, wherein the assigning scan cells comprises:
assigning to a compacting partition a first scan cell having a highest number of combinational paths directed from other scan cells;
assigning to a stimuli partition scan cells having combinational paths to the first scan cell;
assigning to the compacting partition scan cells having combinational paths directed from scan cells in the stimuli partition; and
assigning to the stimuli partition scan cells having combinational paths to scan cells in the compacting partition.

5. The method recited in claim 4, wherein the assigning scan cells further comprises:
determining whether a predetermined condition on non-mission scan cells is satisfied; and
if the predetermined condition is satisfied, storing information of the stimuli partition and the compacting partition as an assignment.

6. The method recited in claim 5, wherein the assigning scan cells further comprises:
if the predetermined condition is unsatisfied, assigning to the compacting partition scan cells having combinational paths directed from scan cells in the compacting group.

7. The method recited in claim 1, wherein the generating employs a graph coloring approach.

8. The method recited in claim 1, wherein the forming scan chains comprises:
combining scan cell partitions in the plurality of scan cell partitions to form scan chains based on a cost function for the plurality of scan chains, the cost function measuring numbers of combination paths between partitions.

9. One or more non-transitory computer-readable media storing computer-executable instructions for causing one or more processors of an electronic design automation (EDA) computer to perform a method, the method comprising:
receiving information of a plurality of scan cells in a design of a circuit;
generating a plurality of scan cell partitions based on combinational paths between scan cells in the plurality of scan cells;
stitching together scan chains in the circuit design using the plurality of scan cell partitions based on at least information of combinational paths between scan cell partitions in the plurality of scan cell partitions;

coupling the scan chains to a mode configuration register;

wherein the scan chains are configured to be dynamically divided into three groups during testing the circuit based on control signals stored in the mode configuration register, the groups configured to operate in a shifting-launching mode, a capturing-compacting-shifting mode, and a mission mode, respectively; and storing information of the scan chains.

10. The one or more non-transitory computer-readable media recited in claim 9, wherein a scan chain in the capturing-compacting-shifting mode shifts out one bit of previously compacted test response data while compacting remaining bits of the previously compacted test response data with a currently-captured test response to form currently compacted test response data.

11. The one or more non-transitory computer-readable media recited in claim 9, wherein the generating comprises:

assigning scan cells to one or more pairs of the scan cell partitions based on combinational paths between scan cells in the plurality of scan cells, each of the one or more pairs of the scan cell partitions comprising one stimuli partition and one compacting partition.

12. The one or more non-transitory computer-readable media recited in claim 11, wherein the assigning scan cells comprises:

assigning to a compacting partition a first scan cell having a highest number of combinational paths directed from other scan cells;

assigning to a stimuli partition scan cells having combinational paths to the first scan cell;

assigning to the compacting partition scan cells having combinational paths directed from scan cells in the stimuli partition; and assigning to the stimuli partition scan cells having combinational paths to scan cells in the compacting partition.

13. The one or more non-transitory computer-readable media recited in claim 12, wherein the assigning scan cells further comprises:

determining whether a predetermined condition on non-mission scan cells is satisfied; and if the predetermined condition is satisfied, storing information of the stimuli partition and the compacting partition as an assignment.

14. The one or more non-transitory computer-readable media recited in claim 13, wherein the assigning scan cells further comprises:

if the predetermined condition is unsatisfied, assigning to the compacting partition scan cells having combinational paths directed from scan cells in the compacting group.

15. The one or more non-transitory computer-readable media recited in claim 9, wherein the generating employs a graph coloring approach.

16. The one or more non-transitory computer-readable media recited in claim 9, wherein the forming scan chains comprises:

combining scan cell partitions in the plurality of scan cell partitions to form scan chains based on a cost function for the plurality of scan chains, the cost function measuring numbers of combination paths between partitions.

17. An electronic design automation (EDA) computing system, comprising:

one or more processing units;

one or more non-transitory computer-readable media storing computer-executable instructions of an electronic design automation tool for causing the one or more processors to perform a method, the method comprising:

receiving information of a plurality of scan cells in a design of a circuit;

generating a plurality of scan cell partitions based on combinational paths between scan cells in the plurality of scan cells;

forming scan chains using the plurality of scan cell partitions based on at least information of combinational paths between scan cell partitions in the plurality of scan cell partitions;

coupling the formed scan chains to a mode configuration register;

wherein the scan chains are configured to be dynamically divided into three groups during testing the circuit based on control signals stored in the mode configuration register, the groups configured to operate in a shifting-launching mode, a capturing-compacting-shifting mode, and a mission mode, respectively; and storing information of the scan chains to enable future retrieval and stitching of the scan chains in the circuit design.

18. The electronic design automation (EDA) computing system of claim 17, wherein the generating comprises:

assigning scan cells to one or more pairs of the scan cell partitions based on combinational paths between scan cells in the plurality of scan cells, each of the one or more pairs of the scan cell partitions comprising one stimuli partition and one compacting partition.

19. The electronic design automation (EDA) computing system of claim 18, wherein the assigning scan cells comprises:

assigning to a compacting partition a first scan cell having a highest number of combinational paths directed from other scan cells;

assigning to a stimuli partition scan cells having combinational paths to the first scan cell;

assigning to the compacting partition scan cells having combinational paths directed from scan cells in the stimuli partition; and assigning to the stimuli partition scan cells having combinational paths to scan cells in the compacting partition.

20. The electronic design automation (EDA) computing system of claim 17, wherein the forming scan chains comprises:

combining scan cell partitions in the plurality of scan cell partitions to form scan chains based on a cost function for the plurality of scan chains, the cost function measuring numbers of combination paths between partitions.

* * * * *